(12) United States Patent
Hirakawa et al.

(10) Patent No.: US 7,629,807 B2
(45) Date of Patent: Dec. 8, 2009

(54) ELECTRICAL TEST PROBE

(75) Inventors: Hideki Hirakawa, Aomori (JP); Akira Soma, Aomori (JP); Takayuki Hayashizaki, Aomori (JP); Shinji Kuniyoshi, Tokyo (JP); Masahisa Tazawa, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 64 days.

(21) Appl. No.: 11/995,279

(22) PCT Filed: Aug. 9, 2005

(86) PCT No.: PCT/JP2005/014871
§ 371 (c)(1),
(2), (4) Date: Jan. 10, 2008

(87) PCT Pub. No.: WO2007/017955

PCT Pub. Date: Feb. 15, 2007

(65) Prior Publication Data
US 2009/0058441 A1    Mar. 5, 2009

(51) Int. Cl.
*G01R 31/02* (2006.01)
(52) U.S. Cl. .................................. 324/762
(58) Field of Classification Search .............. 324/762
See application file for complete search history.

(56) References Cited

U.S. PATENT DOCUMENTS

| 5,448,016 | A | * | 9/1995 | DiPaolo et al. ........... 174/126.1 |
|---|---|---|---|---|
| 6,033,233 | A | | 3/2000 | Haseyama et al. |
| 6,573,738 | B1 | | 6/2003 | Matsuo et al. |
| 6,624,648 | B2 | * | 9/2003 | Eldridge et al. ............. 324/761 |
| 6,920,689 | B2 | * | 7/2005 | Khandros et al. ............. 29/860 |
| 2002/0008530 | A1 | | 1/2002 | Kim et al. |
| 2002/0060579 | A1 | | 5/2002 | Haseyama et al. |

FOREIGN PATENT DOCUMENTS

| JP | 11-162270 A | 6/1999 |
|---|---|---|
| JP | 2000-111577 A | 4/2000 |
| JP | 2000-338131 A | 12/2000 |
| JP | 2001-337110 A | 12/2001 |
| JP | 2004-150874 A | 5/2004 |
| JP | 2004-340617 A | 12/2004 |
| JP | 2004-340654 A | 12/2004 |

* cited by examiner

*Primary Examiner*—Ha Tran T Nguyen
*Assistant Examiner*—Roberto Velez
(74) *Attorney, Agent, or Firm*—Ingrassia Fisher & Lorenz, P.C.

(57) ABSTRACT

A probe for electrical test comprises a plate-shaped main portion having a base end to be attached to a support board and a tip end opposite the base end, and a probe tip portion arranged at the tip end of the main portion and having a probe tip to contact an electrode of a device under test, the main portion being made of a tenacity material. The main portion includes a conductive material extending from the base end to the tip end and at least part of which is buried within the tenacity material, and the tenacity material has higher resiliency than that of the conductive material while the conductive material has higher conductivity than that of the tenacity material. As a result, disorder of a signal provided via the probe is decreased without losing elastic deformation.

9 Claims, 15 Drawing Sheets

(A)

(B)

(C)

(D)

(A)

(B)

(C)

(D)

(A)

(B)

(C)

(D)

US 7,629,807 B2

ELECTRICAL TEST PROBE

TECHNICAL FIELD

The present invention relates to a probe for use in an electrical test of a flat-plate-shaped device under test such as a semiconductor integrated circuit.

BACKGROUND ART

A flat-plate-shaped device under test such as a semiconductor integrated circuit undergoes an electrical test to determine whether or not it is manufactured in accordance with the specification. The electrical test of this kind is performed by using an electrical connecting apparatus, such as a probe card, a probe block, a probe unit, or the like, having a plurality of probes (contactors) to be thrust to respective electrodes of the device under test. The electrical connecting apparatus of this kind is used to electrically connect the electrodes of the device under test to an electrical circuit, that is, a tester in an electrical test system.

As an example of the probe to be used in the electrical connecting apparatus of this kind is raised a blade-type probe manufactured by using a so-called photolithographic technique in which exposure of a photoresist and etching are performed, an electroforming technique in which a resulting etched part is electroplated, and so on (Patent Document 1).

Patent Document 1: Japanese Unexamined Patent Publication No. 2004-340654

The aforementioned blade-type probe includes a seat region (attachment portion) supported on a support board such as a wiring board or a ceramic board, an arm region (arm portion) extending in a first direction from the lower end portion of the seat region, a tip end region (pedestal portion) continuing integrally into the lower side of the tip end portion of this arm region, and a probe tip region (probe tip portion) protruded downward from the lower end surface of this tip end region.

The seat region, arm region and tip end region constitute a main portion of the probe. The probe tip region has a contact portion (i.e., probe tip) protruded toward a device under test and to be thrust to an electrode of the device under test.

Such a plurality of probes are fixed to conductive portions (connection lands) of the support board at the upper end portions of their seat regions by a conductive adhesive such as solder to be formed into a probe assembly. The formed probe assembly is formed into an electrical connecting apparatus, and the electrical connecting apparatus is incorporated into an electrical test system.

The contact portion of the aforementioned conventional probe is thrust to an electrode of a device under test during a test in a state where the electrical connecting apparatus is incorporated in the electrical test system. This causes overdriving to act on each probe. The arm region of each probe is curved by elastic deformation, and the contact portion slides on the electrode of the device under test.

In the above state, power is supplied from the tester to a predetermined probe, and a signal obtained at a predetermined probe from the device under test is returned to the tester.

The aforementioned conventional probe is made of a highly resilient or toughness (pliability) metal material (i.e., tenacity metal material) such as nickel or its alloy so that its arm region is elastically deformed and curved by overdriving, and the arm region is divided into two portions consisting of paired first and second arm portions spaced from each other in a second direction by an elongated hole penetrating the arm region in the thickness direction and extending in the first direction.

Thus, electrical resistance of the conventional probe is higher than that of a conductive material such as copper. In particular, since the cross-sectional area of the two arm portions is small, electrical resistance of these arm portions is high.

In terms of the aforementioned probe having high electrical resistance, when a rectangular wave signal is supplied to the probe, rise edge and fall edge of a signal provided to the tester from the device under test via the probe are disordered. Thus, no accurate test can be performed.

DISCLOSURE OF THE INVENTION

Problems to be Solved by the Invention

It is an object of the present invention to decrease disorder of a signal provided to a tester via a probe without losing elastic deformation.

Means to Solve the Problems

A first probe according to the present invention comprises a plate-shaped main portion having a base end to be attached to a support board and a tip end opposite the base end, and a probe tip portion arranged at the tip end of the main portion and having a probe tip to contact an electrode of a device under test, wherein the main portion is made of a tenacity material. The main portion includes a conductive material extending from the base end to the tip end and at least part of which is buried within the tenacity material, and the tenacity material has higher resiliency i.e., tenacity than that of the conductive material while the conductive material has higher conductivity than that of the tenacity material.

According to the first probe of the present invention, since the tenacity material and the conductive material continuously extend from the base end through the tip end, and at least part of the conductive material is buried within the tenacity material, when overdriving acts on the probe, elastic deformation of the probe is kept in a similar manner to that of a conventional probe due to the tenacity material, but still electrical resistance of the probe is lower than that of the conventional probe. As a result, disorder of a signal provided to a tester from a device under test via the probe is decreased without losing elastic deformation.

Also, according to the first probe of the present invention, since at least part of the conductive material is buried within the tenacity material, bonding force between the tenacity material and the conductive material is strong, and separation from each other caused by elastic deformation is prevented.

A second probe according to the present invention comprises a plate-shaped main portion having a base end to be attached to a support board and a tip end opposite the base end, and a probe tip portion arranged at the tip end of the main portion and having a probe tip to contact an electrode of a device under test, wherein the main portion is made of a resilient i.e., tenacity material. The main portion comprises a plate-shaped seat region having the base end, a plate-shaped arm region extending in a cantilevered manner in a first direction from the other end portion opposite the base end side of the seat region, and a plate-shaped tip end region protruded from the tip end of the arm region in a second direction intersecting with the first direction and having the tip end. The arm region includes a pair of first and second arm portions spaced from each other in the second direction by an elongated hole penetrating the arm region in its thickness direction and extending in the first direction and is electrically short-circuited by a low resistance material extending in the first direction within the elongated hole from one end portion to the other end portion of the elongated hole in its longitudinal direction. The tenacity material has higher resiliency i.e., tenacity than that of the low resistance material while the low resistance material has higher conductivity than that of the tenacity material.

In the second probe according to the present invention, since the arm portions of the main portion made of the tenacity material are electrically short-circuited by the low resistance material extending in the first direction within the elongated hole formed through the arm portions from one end portion to the other end portion of the elongated hole in its longitudinal direction, when overdriving acts on the probe, elastic deformation of the probe is kept in a similar manner to that of a conventional probe due to the tenacity material, but still electrical resistance of the probe is lower than that of the conventional probe especially at the arm region. As a result, disorder of a signal provided to a tester from a device under test via the probe is decreased without losing elastic deformation.

In the first probe according to the present invention, the main portion may include a plate-shaped seat region having the base end, a plate-shaped arm region extending in a cantilevered manner in a first direction from the other end portion opposite the base end side of the seat region, and a plate-shaped tip end region protruded from the tip end of the arm region in a second direction intersecting with the first direction and having the tip end. The arm region may include a pair of first and second arm portions spaced from each other in the second direction by an elongated hole penetrating the arm region in its thickness direction and extending in the first direction and may be electrically short-circuited by a low resistance material extending in the first direction within the elongated hole from one end portion to the other end portion of the elongated hole in its longitudinal direction.

In the second probe according to the present invention, the main portion may include a conductive material at least part of which is buried within the tenacity material, and the tenacity material may have higher resiliency than that of the conductive material while the conductive material may have higher conductivity than that of the tenacity material.

The conductive material may be exposed at the base end and may contact the probe tip portion. Also, the conductive material may be buried within the tenacity material. Further, the conductive material may be exposed on one surface of the main portion. Still further, the conductive material may have a first conductor exposed on one surface of the main portion and a second conductor exposed on the other surface of the main portion.

The probe tip portion may be made of a conductive metal material having higher hardness than that of the tenacity material. Also, the probe tip portion may further have a seat portion coupled integrally with the tip end, and the probe tip may be protruded in the second direction from the seat portion.

DESCRIPTION OF THE SYMBOLS

Figure 1:
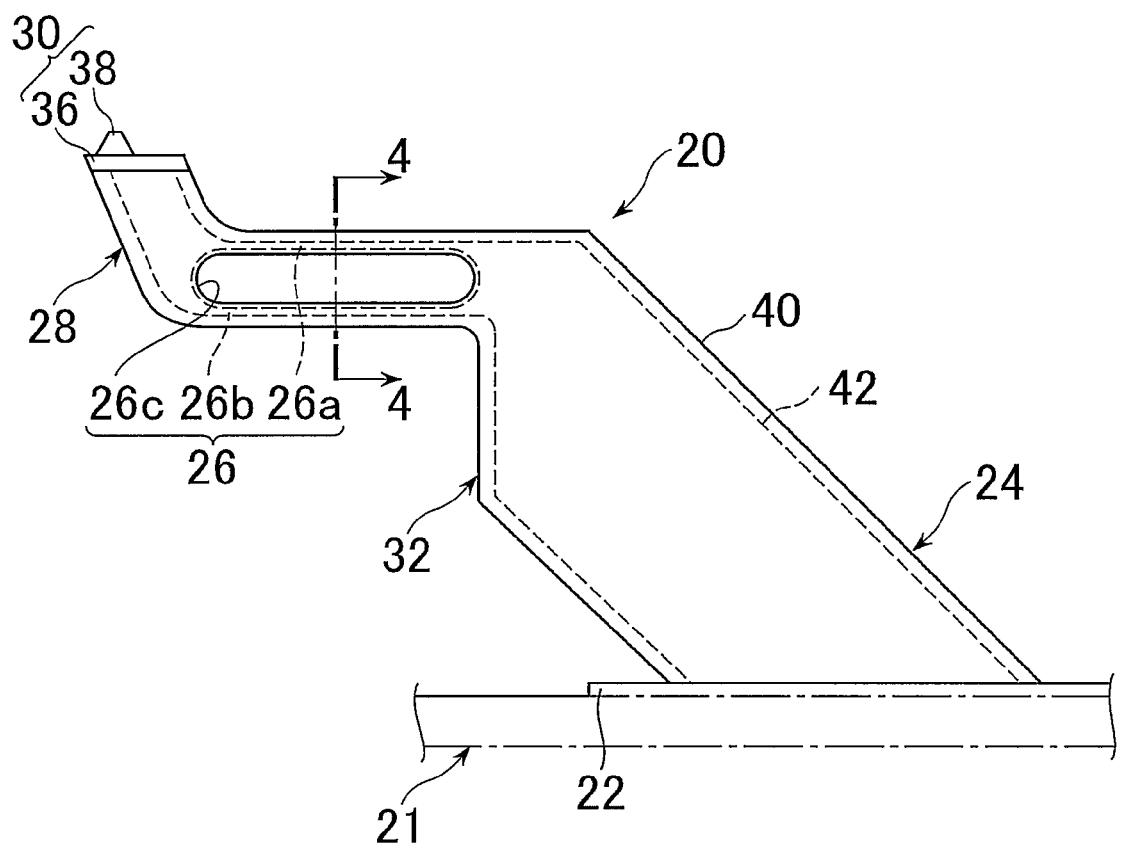
FIG. 1 is a front view showing a first embodiment of a probe according to the present invention.

20, 78, 92 probe
21 support board
22 connection land
24 seat region
26 arm region
26a, 26b arm portion
26c elongated hole
28 tip end region
30 probe tip region (probe tip portion)
32 main portion
36 seat portion
38 contact portion
40 highly tenacity material
42, 42a, 42b highly conductive material
44 conductive adhesive
80 electrical connecting apparatus
82 wiring board
84 probe board (support board)
86 tester land
88 wire
90 electrical insulating substrate
94, 94a, 94b low resistance material

BEST MODE FOR CARRYING OUT THE INVENTION

Hereinafter, in FIG. 1 which is shown to be upside down, the left-right direction is referred to as a left-right direction (first direction), the up-down direction is referred to as an up-down direction (second direction), and the direction perpendicular to the sheet is referred to as a front-back direction. These directions differ depending on the angle of a chuck top against the horizontal plane, the chuck top receives a device under test to which power is to be supplied. The device under test can be an integrated circuit (IC).

Embodiment of a Probe

Referring to FIGS. 1 to 4, a probe 20 includes a plate-shaped seat region 24 to be attached to a connection land 22 of a support board 21 such as a wiring board or a ceramic board, a plate-shaped arm region 26 extending to one side in the left-right direction from the upper end portion of the seat region 24, a plate-shaped tip end region 28 protruded upward from the tip end of the arm region 26, and a probe tip portion or a probe tip region 30 protruded upward from the tip end region 28.

The seat region 24, the arm region 26, and the tip end region 28 are formed in plate shapes and form a plate-shaped main portion 32 collectively. Accordingly, the probe 20 is adapted to be an entirely plate-shaped probe, that is, a blade-type probe.

The main portion 32 has a connection land 22 side or a base end side and a probe tip region 30 side or a tip end side. The seat region 24 continues integrally into the arm region 26 at its upper end portion.

The arm region 26 shapes a plate extending to one side in the left-right direction from the upper end portion of the seat region 24 and has upper and lower arm portions 26a, 26b formed by an elongated hole 26c elongated in the left-right direction.

The tip end region 28 is bent in a state of protruding upward from the tip end of the arm region 26. The thickness dimension of the tip end region 28 may be the same as the thickness dimensions of the seat region 24 and the arm region 26 as in the example shown in FIG. 2 or may be shorter than the thickness dimensions of the seat region 24 and the arm region 26.

The probe tip region 30 has a seat portion 36 fixed on the upper end surface, that is, the tip end surface of the tip end region 28 and a contact portion 38 protruded further upward from the seat portion 36. In the example shown in the figures, the contact portion 38 is formed in a truncated pyramidal shape. However, it may be formed in another shape such as a truncated conical shape, a pyramidal shape, a conical shape, or the like.

The main portion 32 is made of a highly resilient or toughness (pliability) metal material i.e., tenacity metal material 40 having high resiliency i.e., tenacity such as nickel, its alloy, phosphor bronze, or the like and a strip-shaped highly conductive material 42 having high conductivity such as gold and arranged in the highly tenacity material 40 in a state of being buried completely within the highly tenacity material 40.

The tenacity material 40 has higher tenacity than that of the conductive material 42, and the conductive material 42 has higher conductivity than that of the tenacity material 40. Both the tenacity material 40 and the conductive material 42 are made of metal materials.

In the example shown in the figures, the highly conductive material 42 extends continuously from the base end to the tip end of the main portion 32 so that it is exposed on the lower end surface or the base end surface and the upper end surface or the tip end surface of the main portion 32 and contacts with the seat portion 36 of the probe tip region 30 on the tip end side.

Although the highly conductive material 42 is a single piece at the seat region 24 and the tip end region 28, it is divided into two pieces passing the first and second arm portions 26a and 26b at the arm region 26.

The probe tip region 30 is made of a conductive highly hard metal material, such as cobalt, rhodium, or their alloys, having higher hardness than that of the highly tenacity material 40 or the highly conductive material 42.

As shown in FIG. 1, the probe 20 is adhered to the connection land 22 at the end portion on the base end side of the main portion 32 by a conductive adhesive 44 (refer to FIG. 15) such as solder in a state where it is turned upside down, and where the base end surface of the seat region 24 and the highly conductive material 42 are contacted with the connection land 22 so as to be attached to the connection land 22 in an upright state from the support board 21. Thus, the probe 20 is supported on the support board 21 in a cantilevered manner.

The conductive adhesive 44 may be adhered to the connection land 22 or the end portion on the base end side of the main portion 32 in advance, be melted by irradiation of laser beam, and be hardened by termination of the laser beam irradiation.

During an electrical test, the contact portion 38 of the probe 20 is thrust to an electrode of a device under test in a state where the up-down position of the probe 20 is turned opposite to one shown in FIG. 1. This causes overdriving to act on the probe 20, and the arm region 26 of the probe 20 is elastically deformed.

When the contact portion 38 is thrust to the electrode of the device under test, overdriving acts on the probe 20, the arm region 26 of the probe 20 is bent by elastic deformation, and the contact portion 38 slides on the electrode of the device under test. As a result, an oxide film of the electrode of the device under test is scraped away from its surface.

In the above state, power is supplied from a tester to a predetermined probe 20 for power supply while a signal from the device under test is returned to the tester via a predetermined probe 20 for detection.

According to the probe 20, since the highly tenacity material 40 and the highly conductive material 42 continuously extend from the base end through the tip end, and at least part of the highly conductive material 42 is buried within the highly tenacity material 40, when overdriving acts on the probe 20, elastic deformation of the probe 20 is kept in a similar manner to that of a conventional probe due to the highly tenacity material 40, but still electrical resistance of the probe 20 is lower than that of the conventional probe. As a result, disorder of the signal provided to the tester from the device under test via the probe is decreased without losing elastic deformation.

Also, according to the probe 20, since the highly conductive material 42 is buried within the highly tenacity material 40, bonding force between the highly tenacity material 40 and the highly conductive material 42 is strong, and separation from each other caused by elastic deformation is prevented reliably.

Modification Example of the Aforementioned Probe

The highly conductive material 42 may not be buried in the highly tenacity material 40 so that it is concealed within the highly tenacity material 40, but it is only necessary that at least part of it be buried in the highly tenacity material 40.

Figure 5:
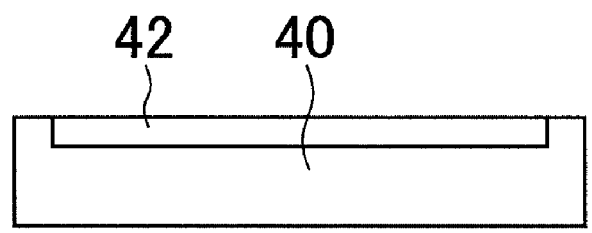
FIG. 5 is a bottom view showing a modification example of the probe shown in FIG. 1.
Figure 6:
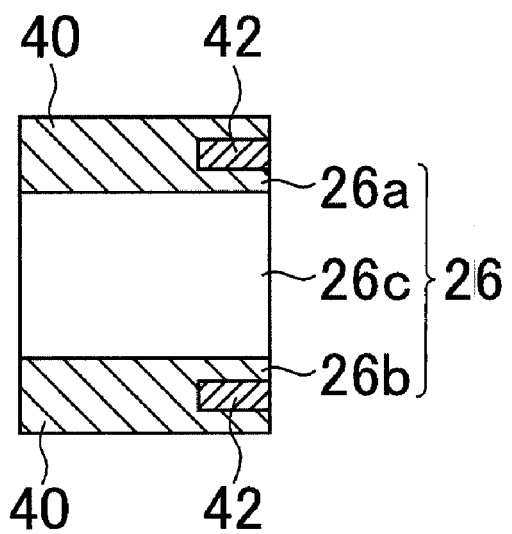
FIG. 6 is a cross-sectional view, similar to FIG. 4, showing the modification example of the probe shown in FIG. 5.

As shown in FIGS. 5 and 6, part of the highly conductive material 42 may be exposed on one surface of the main portion 32 across the entire length range of the main portion 32.

Figure 7:
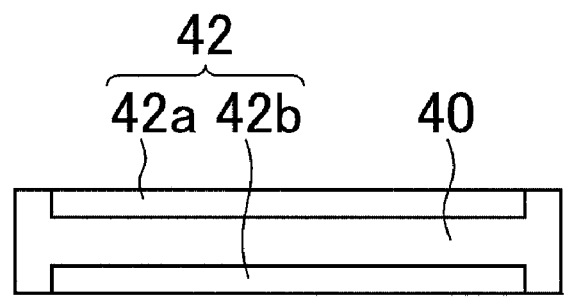
FIG. 7 is a bottom view showing another modification example of the probe shown in FIG. 1.
Figure 8:
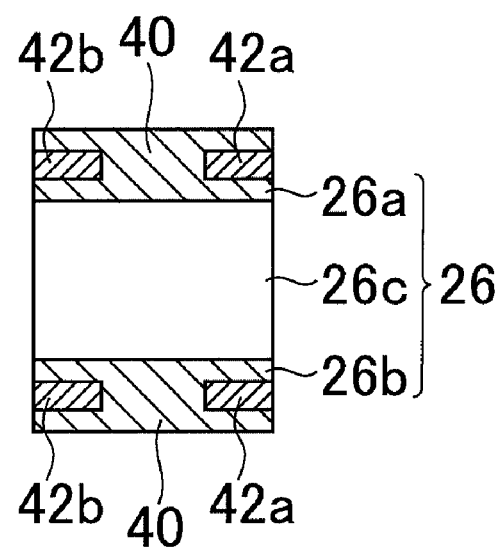
FIG. 8 is a cross-sectional view, similar to FIG. 4, showing the modification example of the probe shown in FIG. 7.

Also, as shown in FIGS. 7 and 8, the highly conductive material 42 may have first and second conductors 42a and 42b. In such a case, part of the first conductor 42a is exposed on one surface of the main portion 32 across the entire length range of the main portion 32. On the other hand, part of the first conductor 42b is exposed on the other surface of the main portion 32 across the entire length range of the main portion 32.

Figure 2:
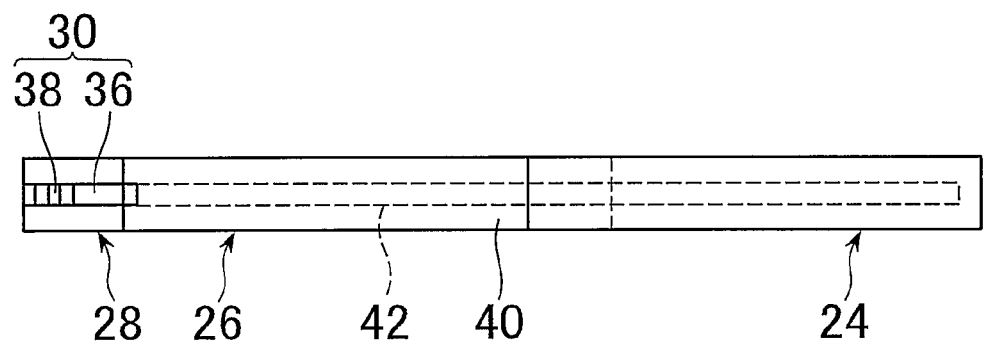
FIG. 2 is a plan view of the probe shown in FIG. 1.
Figure 3:
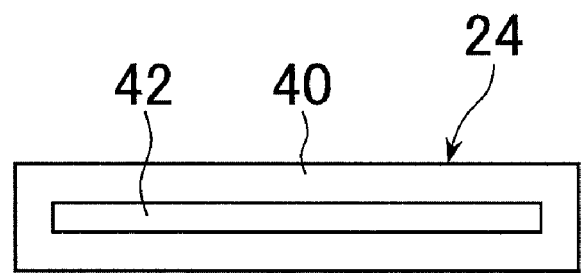
FIG. 3 is a bottom view of the probe shown in FIG. 1.
Figure 4:
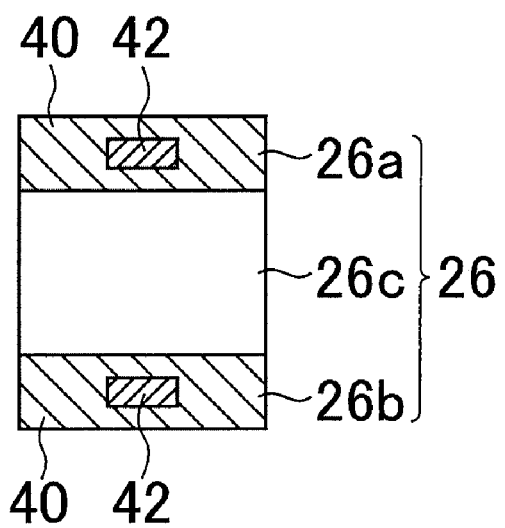
FIG. 4 is a cross-sectional view obtained along the 4-4 line in FIG. 1.

The highly conductive material 42 may not be exposed on the base end surface of the main portion 32. Also, the thickness dimension (dimension in the front-back direction) of the probe tip region 30 may be shorter than the thickness dimension of the main portion 32 as shown in FIG. 2 or may be the same as the thickness dimension of the main portion 32.

Any of the aforementioned probes can be manufactured by utilizing an etching technique, a photolithographic technique, an electroforming technique, a sputtering technique, a deposition technique, etc. with use of a plate member. One example of it is explained below with reference to FIGS. 9 to 12.

Embodiment of a Method for Manufacturing the Aforementioned Probe

Figure 9:
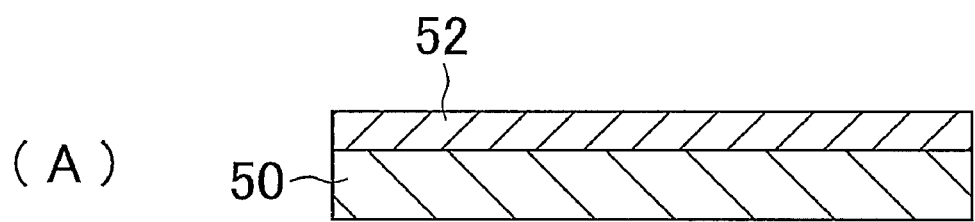
FIG. 9A-9D explain steps for manufacturing the probe shown in FIG. 1.
Figure 9:
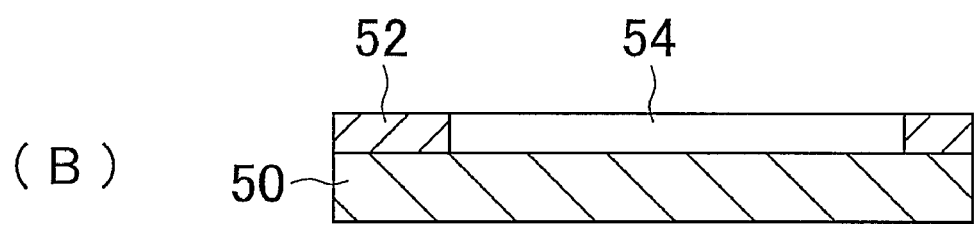
Figure 9:
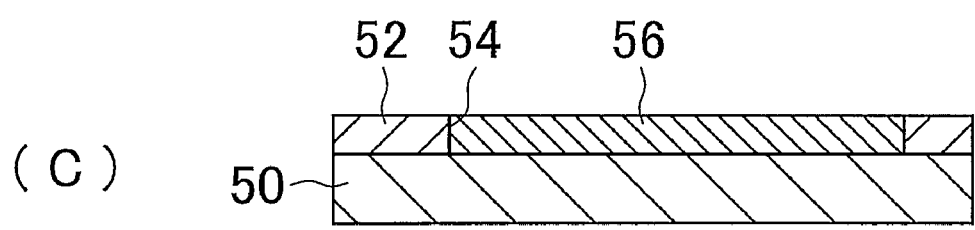
Figure 9:
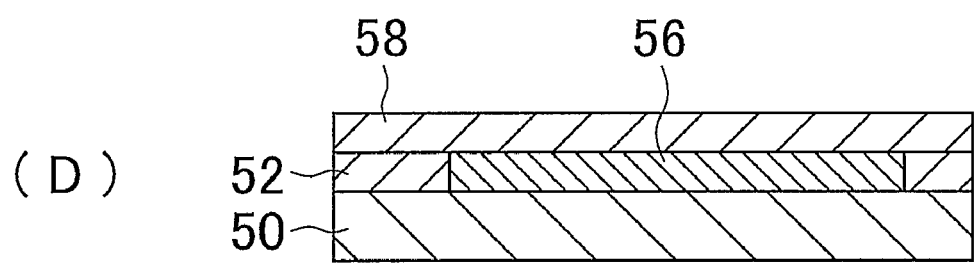

First, as shown in FIG. 9 (A), photoresist is applied on one surface (upper surface) of a base member 50 to form a resist layer 52.

Next, as shown in FIG. 9 (B), the resist layer 52 is exposed and developed so as to form a recess 54 corresponding to the seat region 24, the arm region 26, and the tip end region 28 on the resist layer 52.

Next, as shown in FIG. 9 (C), electroplating is performed with a highly tenacity metal material such as nickel-chromium alloy at an exposed area on the upper surface of the base member 50 exposed via the recess 54 to form a highly tenacity material layer 56 in the recess 54.

Next, as shown in FIG. 9 (D), photoresist is applied on the upper surfaces of the resist layer 52 and the highly tenacity material layer 56 to form a resist layer 58.

Figure 10:
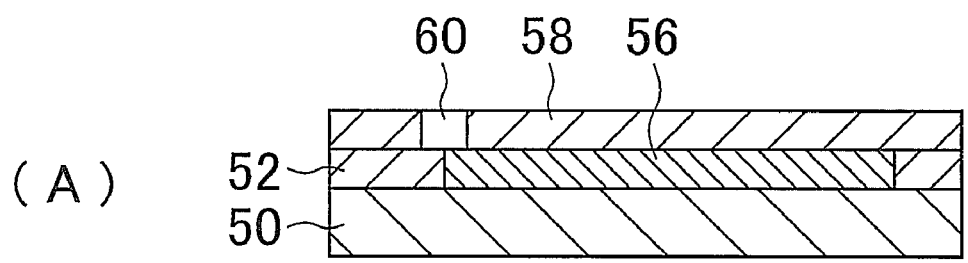
FIG. 10A-10D explain manufacturing steps following FIG. 9D.
Figure 10:
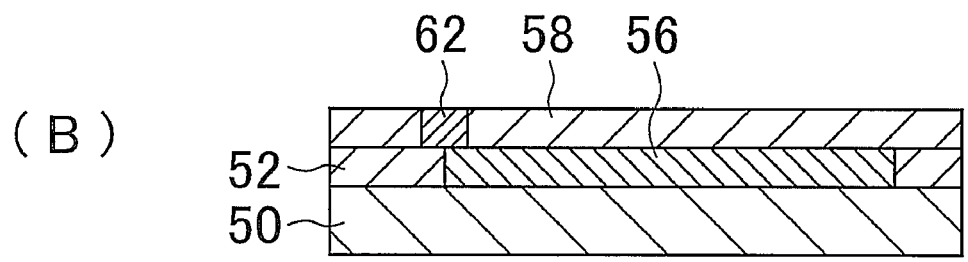
Figure 10:
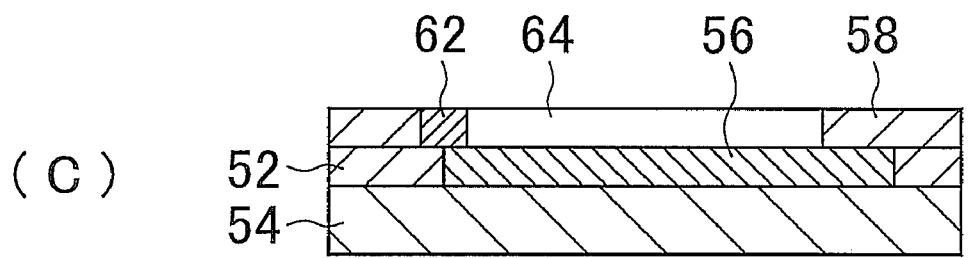
Figure 10:
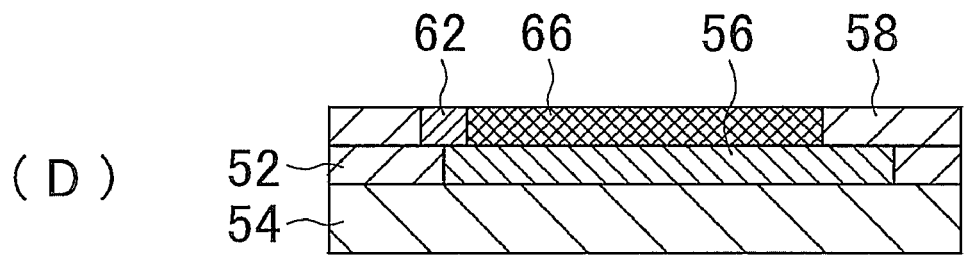

Next, as shown in FIG. 10 (A), the resist layer 58 is exposed and developed so as to form a recess 60 corresponding to the probe tip region 30 on the resist layer 58 functioning as a photosensitive material.

Next, as shown in FIG. 10 (B), electroplating is performed with a highly hard metal material such as cobalt-rhodium alloy at an exposed area on the upper surfaces of the resist layer 52 and the highly tenacity material layer 56 exposed via the recess 60 to form a highly hard metal material layer 62 in the recess 60.

Next, as shown in FIG. 10 (C), the resist layer 58 is exposed and developed so as to form a recess 64 corresponding to the seat region 24, the arm region 26, and the tip end region 28 on the resist layer 58.

Next, as shown in FIG. 10 (D), electroplating is performed with a highly conductive metal material such as gold at an exposed area on the upper surface of the highly tenacity material layer 56 exposed via the recess 64 to form a highly conductive material layer 66 in the recess 64.

Figure 11:
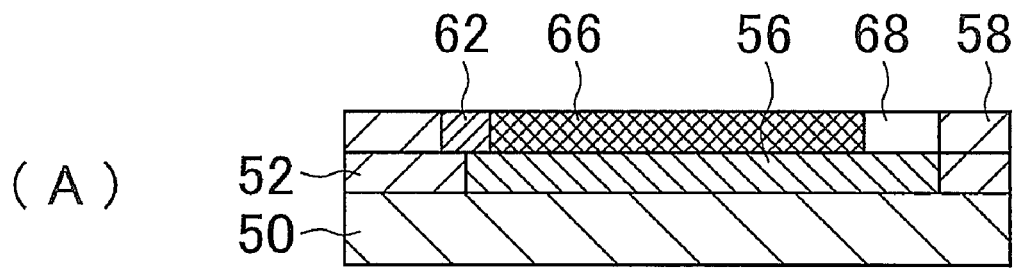
FIG. 11 explains manufacturing steps following FIG. 10A.
Figure 11:
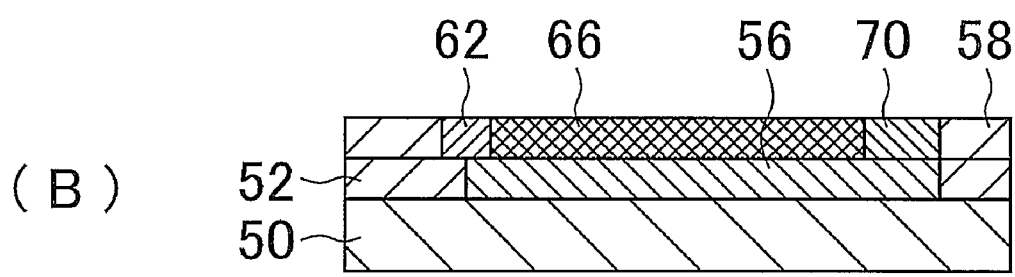
Figure 11:
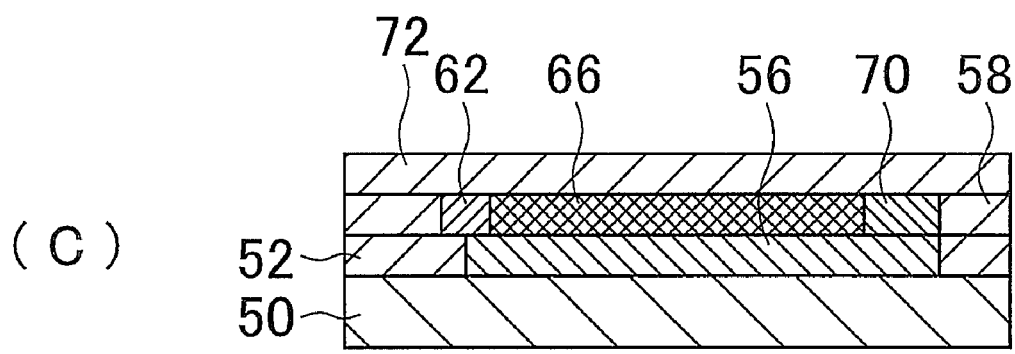

Next, as shown in FIG. 11 (A), the resist layer 58 is exposed and developed so as to form a recess 68 corresponding to the base end portion of the seat region 24 on the resist layer 58.

Next, as shown in FIG. 11 (B), electroplating is performed with a highly tenacity metal material such as nickel-chromium alloy at an exposed area on the upper surface of the highly tenacity material layer 56 exposed via the recess 68 to form a highly tenacity material layer 70 in the recess 68.

Next, as shown in FIG. 11 (C), photoresist is applied on the upper surfaces of the resist layer 58, the highly hard metal material layer 62, the highly conductive material layer 66, and the highly tenacity material layer 70 to form a resist layer 72.

Figure 12:
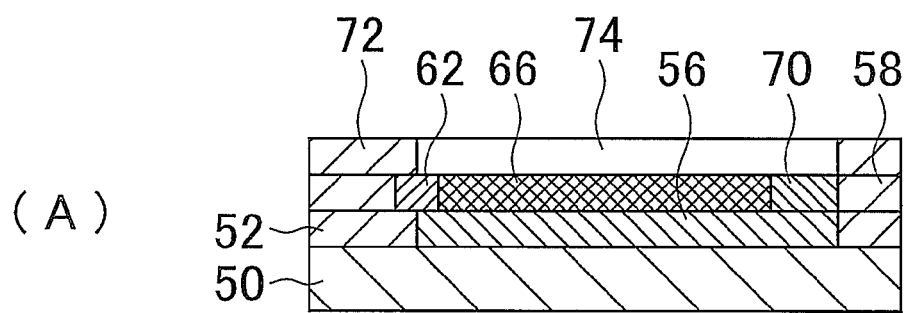
FIG. 12A-12D explain manufacturing steps following FIG. 11.
Figure 12:
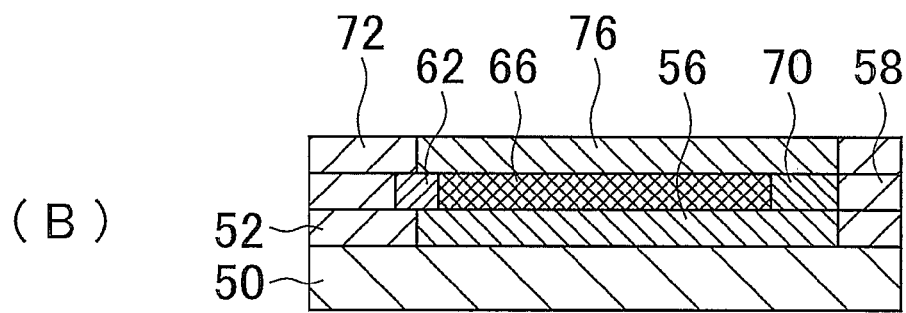
Figure 12:
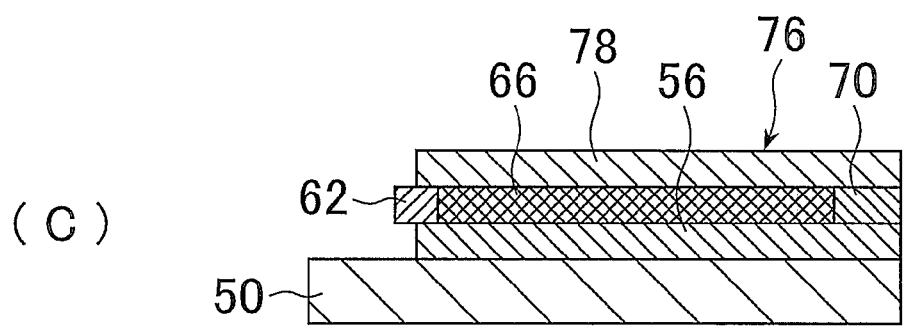
Figure 12:
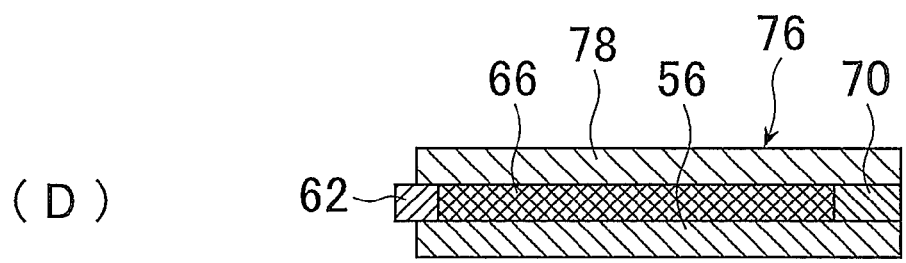
Figure 13:
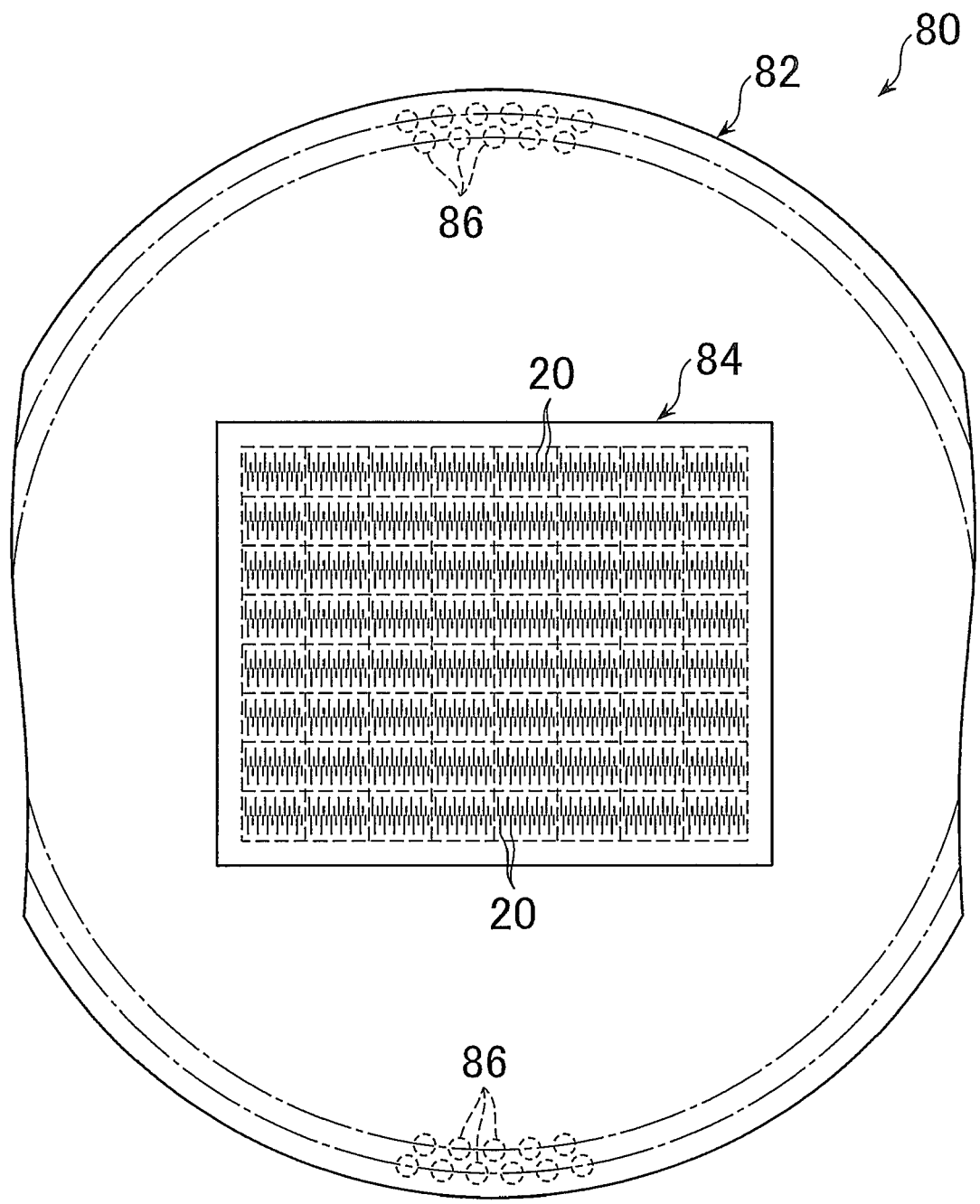
FIG. 13 is a bottom view showing an embodiment of an electrical connecting apparatus using the probe shown in FIG. 1.
Figure 14:
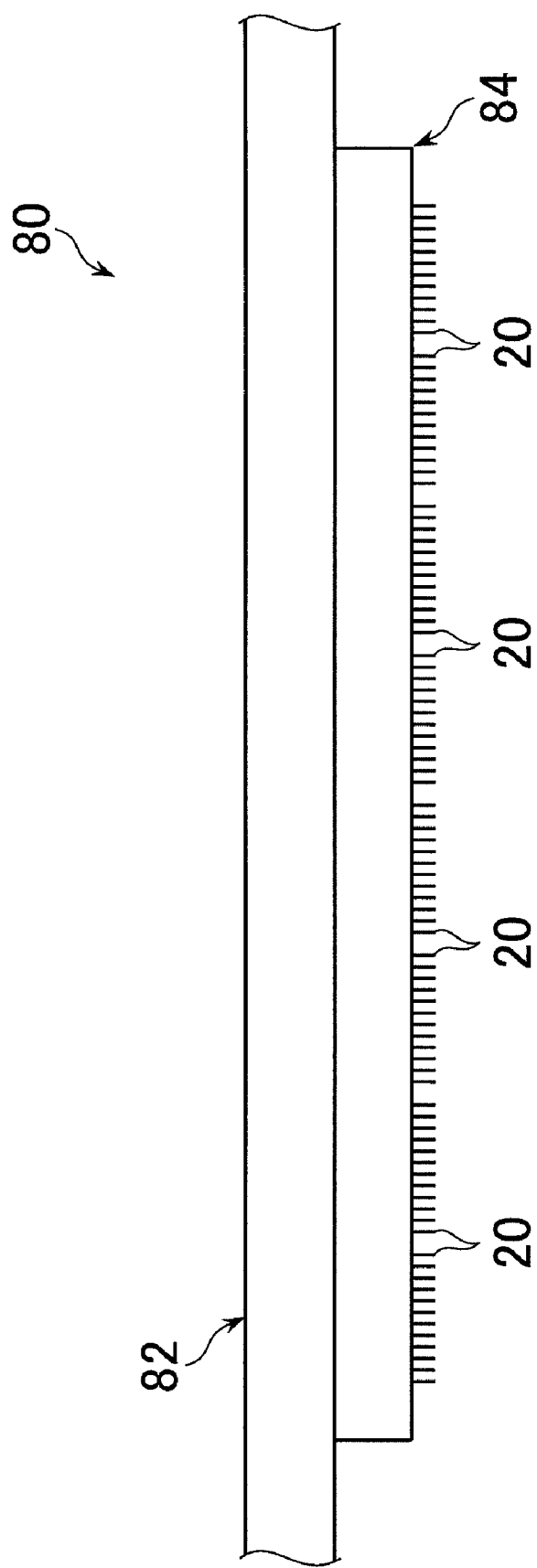
FIG. 14 is a front view of the electrical connecting apparatus shown in FIG. 13.

Next, as shown in FIG. 12 (A), the resist layer 72 is exposed and developed so as to form a recess 74 corresponding to the seat region 24, the arm region 26, and the tip end region 28 on the resist layer 72 functioning as a photosensitive material.

Next, as shown in FIG. 12 (B), electroplating is performed with a highly tenacity metal material such as nickel-chromium alloy at an exposed area on the upper surfaces of the highly hard metal material layer 62, the highly conductive material layer 66, and the highly tenacity material layer 70 exposed via the recess 74 to form a highly tenacity metal material layer 76 in the recess 74.

Next, as shown in FIG. 12 (C), the resist layers 52, 58 are removed to expose a probe 78 consisting of the highly resilient metal material layers 56, 70, and 76, the highly hard metal material layer 62, and the highly conductive material layer 66.

Next, as shown in FIG. 12 (D), the exposed probe 78 is detached from the base member 50.

In the probe 78 manufactured as above, the highly conductive material layer 66 is not exposed on the base end surface of the main portion. However, in a case where the probe 20 shown in FIG. 1, in which the highly conductive material layer 66 is exposed on the base end surface of the main portion, is to be manufactured, it is only necessary to omit the step of making the highly tenacity metal material layer 70.

Embodiment of an Electrical Connecting Apparatus Using the Aforementioned Probe

Next, referring to FIGS. 13 to 16, an embodiment of a probe board having a plurality of probes 20 each constituted as shown in FIG. 1 and an electrical connecting apparatus using it is explained.

Referring to FIGS. 13 to 16, an electrical connecting apparatus 80 is adapted to test as a flat-plate-shaped device under test a semiconductor wafer having a plurality of integrated circuit regions (regions under test) in a matrix form and is constituted so as to enable an electrical test of the plurality of integrated circuit regions or regions under test simultaneously. Each of the regions under test is not cut off.

Each region under test has a plurality of pad electrodes aligned in a line. The pad electrodes of the regions under test adjacent to one another in a front-back direction are aligned in a line.

The electrical connecting apparatus 80 includes a round wiring board 82 and a rectangular probe board 84 arranged on the lower surface of the wiring board 82. The plurality of probes 20 are arranged on one side of the probe board 84 opposite the wiring board 82.

The wiring board 82 has at the rim portion on the upper surface a plurality of tester lands 86 to be connected to a tester (electrical circuit) in an electrical test system and has on one surface or inside a plurality of wires electrically connected respectively to the tester lands 86 although not shown in figures.

In a case where the wiring board 82 is made of epoxy resin containing glass, a reinforcement member may be provided on the upper surface of the wiring board 82. Also, when heat is applied to the electrical connecting apparatus 80, a thermal deformation prevention member that prevents the wiring board 82 and the reinforcement member from being bent due to thermal expansion may be provided on the wiring board 82 and the reinforcement member.

Figure 15:
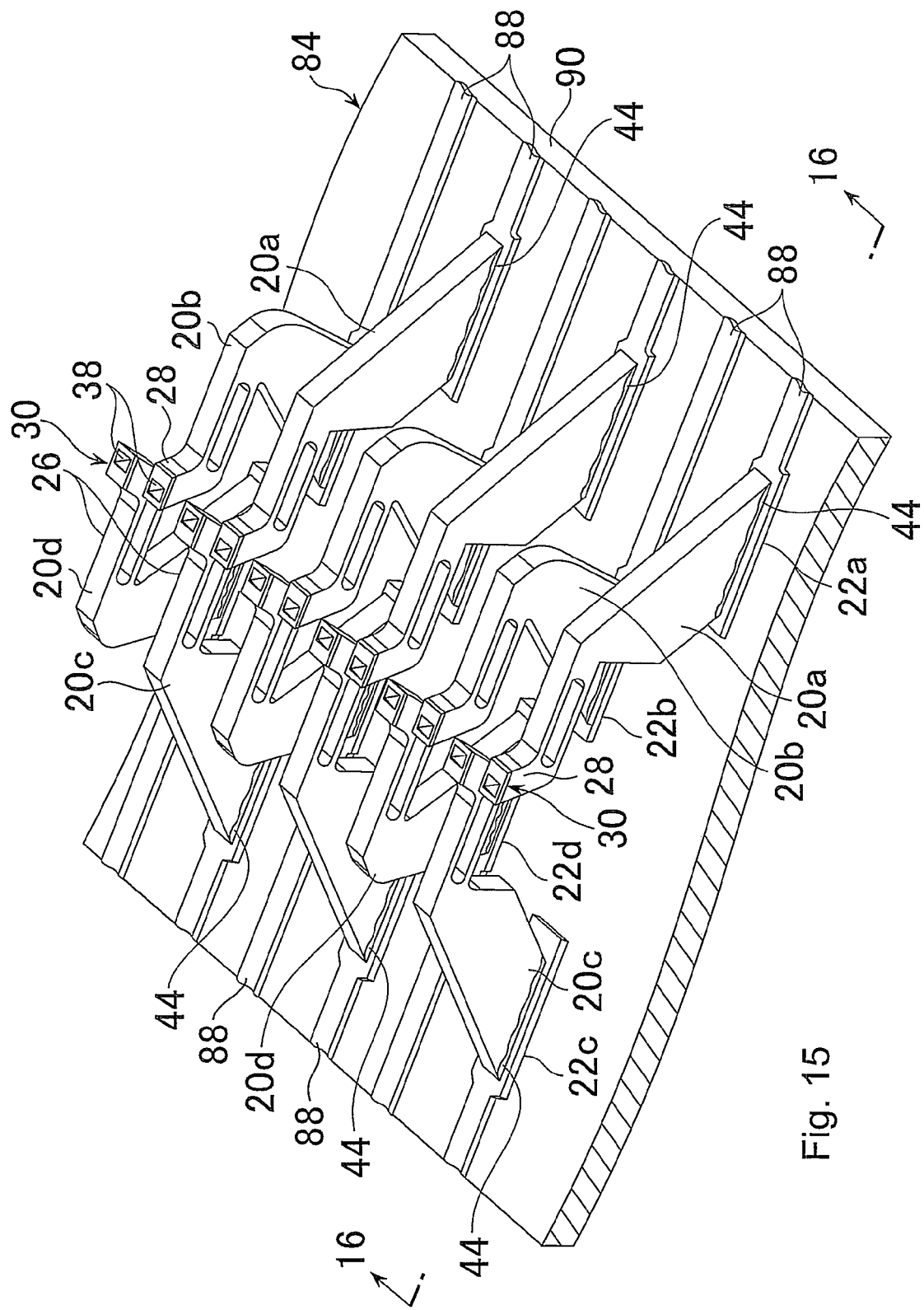
FIG. 15 is a perspective view showing an embodiment of a probe board in the electrical connecting apparatus shown in FIG. 13 in an upside-down state.
Figure 16:
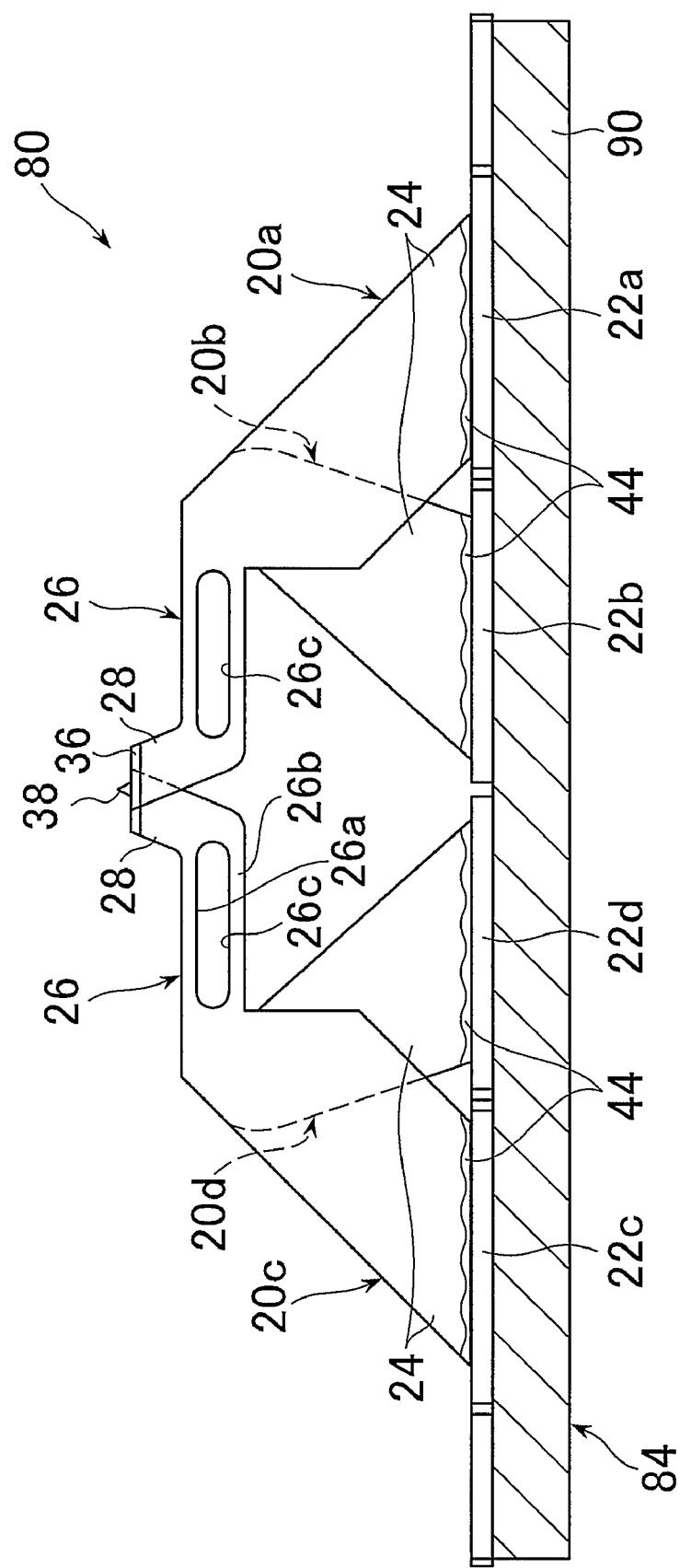
FIG. 16 is a cross-sectional view obtained along the 16-16 line in FIG. 15.
Figure 17:
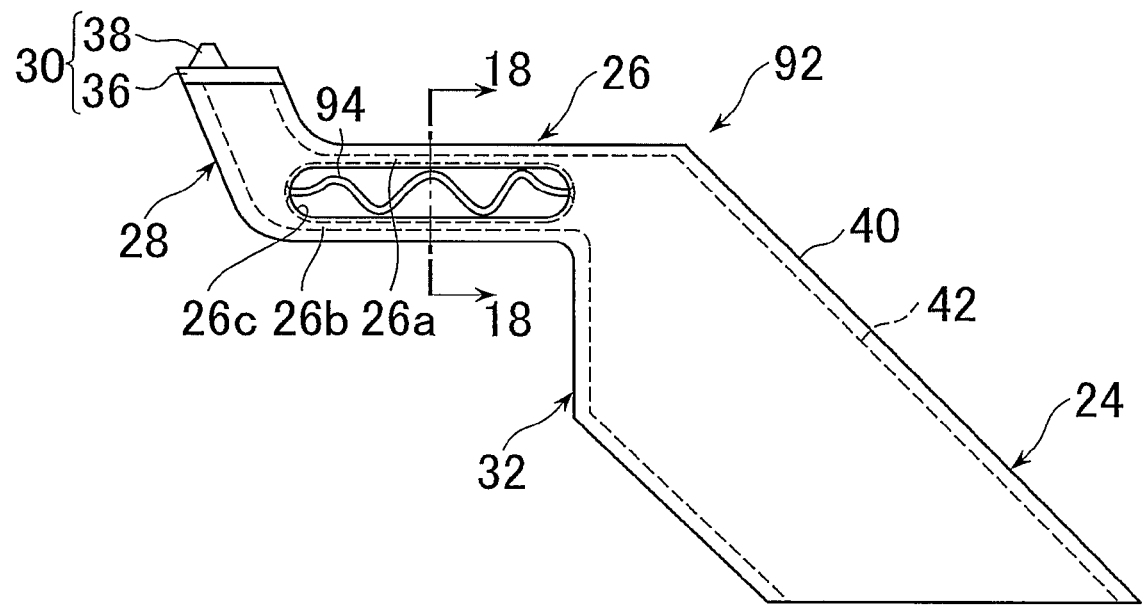
FIG. 17 is a front view showing a second embodiment of a probe according to the present invention.
Figure 18:
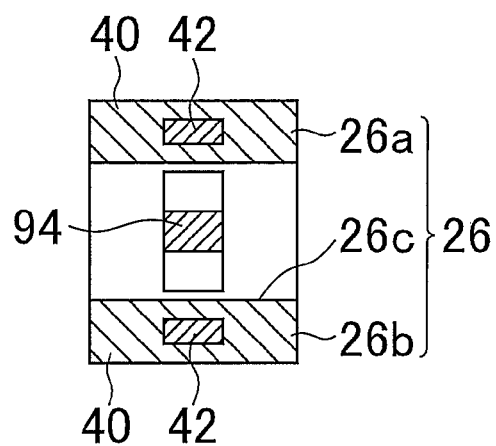
FIG. 18 is a cross-sectional view obtained along the 18-18 line in FIG. 17.

As shown in FIGS. 15 and 16, the probe board 84 has a plurality of connection lands 22 each having conductivity and a plurality of wires 88 individually connected to the connection lands 22 formed on one surface of an electrical insulating substrate 90.

Although the connection lands 22 are connection portions electrically connected to the wires 88 in a one-to-one relationship in the example shown in the figures, each of them may be part of each wire 88. Each wire 88 is electrically connected to the aforementioned not shown wire of the wiring board 82.

The electrical insulating substrate 90 may comprise a ceramic board and a multilayered wiring board arranged integrally with the lower surface of the ceramic board. In such a case, the connection lands 22 are formed on the lower surface of the multilayered wiring board and are electrically connected to the wires provided in the wiring board 82 via wires provided in the multilayered wiring board and wires such as conductive through-holes provided in the ceramic board.

The wiring board 82 and the probe board 84 are mutually positioned by a plurality of positioning pins (not shown) extending through them in the thickness direction and are mutually coupled by a plurality of screw members (not shown).

The connection lands 22 are allocated per region under test that is to be tested simultaneously. The plural connection lands 22 allocated to each region under test are divided into first, second, third, and fourth connection land groups each including plural connection lands 22.

The connection lands 22 grouped in the first, second, third, and fourth connection land groups respectively act as first, second, third, and fourth connection lands. In FIGS. 15 and 16, the first, second, third, and fourth connection lands are shown as numerals 22*a*, 22*b*, 22*c*, and 22*d* expressed by adding alphabets a, b, c, and d to their numerals 22.

The first and second connection lands 22*a* and 22*b* are spaced from each other in the front-back direction, are displaced from each other in the left-right direction, and extend in the left-right direction.

The third and fourth connection lands 22*c* and 22*d* are displaced to one side in the left-right direction opposite the first and second connection lands 22*a* and 22*b*. Also, the third and fourth connection lands 22*c* and 22*d* are spaced from each other in the front-back direction, are displaced from each other in the left-right direction, and extend in the left-right direction.

The probes 20 are also allocated per region under test to be tested simultaneously in the same manner as that of the connection lands 22. The plural probes 20 allocated to each region under test are divided into first, second, third, and fourth probe groups each including plural probes 20.

The probes 20 grouped in the first, second, third, and fourth probe groups respectively act as first, second, third, and fourth probes. In FIGS. 15 and 16, the first, second, third, and fourth probes are shown as numerals 20*a*, 20*b*, 20*c*, and 20*d* expressed by adding alphabets a, b, c, and d to their numerals 20.

The first and second probes 20*a* and 20*b* are spaced from each other in the front-back direction and are displaced from each other in the left-right direction.

The third and fourth probes 20*c* and 20*d* are displaced to one side in the left-right direction opposite the first and second probes 20*a* and 20*b*. Also, the third and fourth probes 20*c* and 20*d* are spaced from each other in the front-back direction and are displaced from each other in the left-right direction.

The first, second, third, and fourth probes 20*a*, 20*b*, 20*c*, and 20*d* are fixed respectively to the connection lands 22*a*, 22*b*, 22*c*, and 22*d* by the conductive adhesive 44 in a state where the arm regions 26 extend in the left-right direction, and where the contact portions 38 are aligned in a line. Thus, in the example shown in the figures, the electrical insulating substrate 90 acts as a support board for the probes 20.

Since the probes 20 and the connection lands 22 corresponding to each region under test are divided into four groups as described above, the wires 88 corresponding to each region under test are also divided into four groups.

The contact portions 38 of the probes 20 corresponding to each region under test are repeatedly arranged in the front-back direction in the order of the first, third, second, and fourth probes 20*a*, 20*c*, 20*b*, and 20*d*. However, the electrically effective length from the tip end of the contact portion 38 of the probe 20 to the connection land 22 is the same.

Accordingly, the seat regions 24 of the first and fourth probes 20*a* and 20*d* are tilted to one side in the left-right direction while the seat regions 24 of the second and third probes 20*b* and 20*c* are tilted to the other side in the left-right direction.

The electrical connecting apparatus 80 is attached to the electrical test system in a state where the up-down position is turned opposite to one shown in FIGS. 15 and 16. In a state where the electrical connecting apparatus 80 is attached to the electrical test system, the contact portion 38 of each probe 20 in the electrical connecting apparatus 80 is thrust to a pad electrode of a device under test.

This causes overdriving to act on each probe 20, and the arm portion of each probe 20 is elastically deformed. In this state, power is supplied from the tester in the electrical test system to a predetermined probe 20 via the tester land 86, the wire in the wiring board 82, and the wire 88 on the probe board 84, and an electrical signal is returned from a predetermined probe 20 to the tester.

Other Embodiments of the Probe

Electrical resistance of the probe 20 is determined especially by the arm region 26 having a small cross-sectional area. Thus, a low resistance material extending in the longitudinal direction of the elongated hole 26*c* of the arm region 26 may be arranged at the arm region 26 to electrically short-circuit members around the elongated hole 26*c* by the low resistance material.

Referring to FIGS. 17 to 21, a probe 92 is constituted similarly to the probe 20 shown in FIG. 1 except the fact that a low resistance material 94 extending in the longitudinal direction of the elongated hole 26*c* is arranged at the arm region 26 to electrically short-circuit members around the elongated hole 26*c* by the low resistance material 94.

The low resistance material 94 is a metal line, such as copper or gold, having lower resistance value (that is, high conductivity) than that of the highly tenacity material 40 and is curved in a waved form. Such a low resistance material 94 can be manufactured integrally with or separately from the probe tip region 30 and the main portion 32 by utilizing an etching technique, a photolithographic technique, an electroforming technique, a sputtering technique, a deposition technique, etc. with use of a plate member.

Modification Example of the Aforementioned Probe

Figure 19:
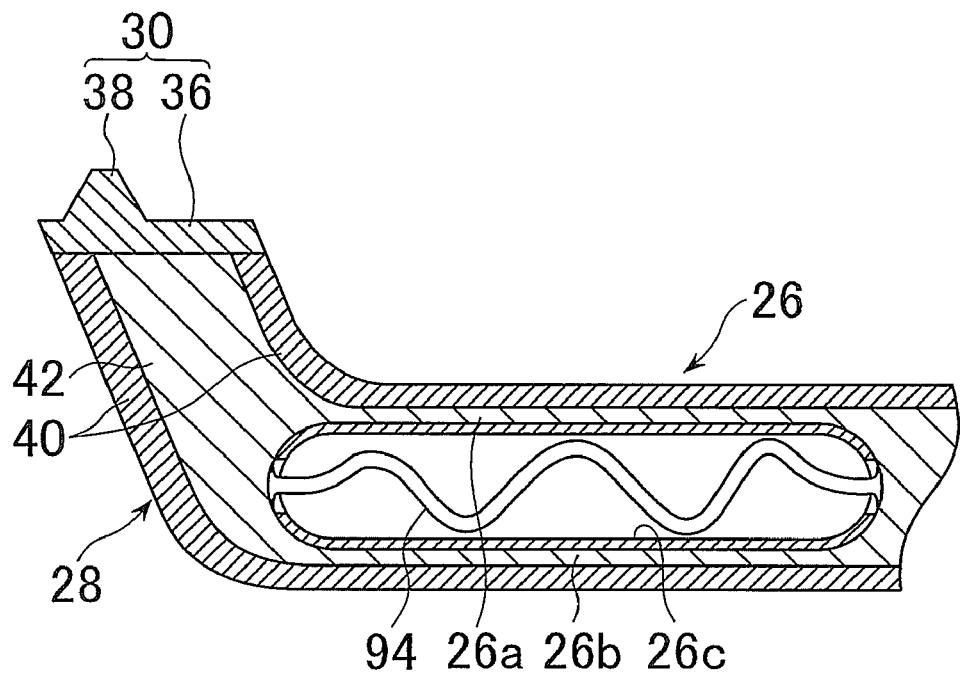
FIG. 19 is a vertical cross-sectional view of the probe shown in FIG. 17.
Figure 20:
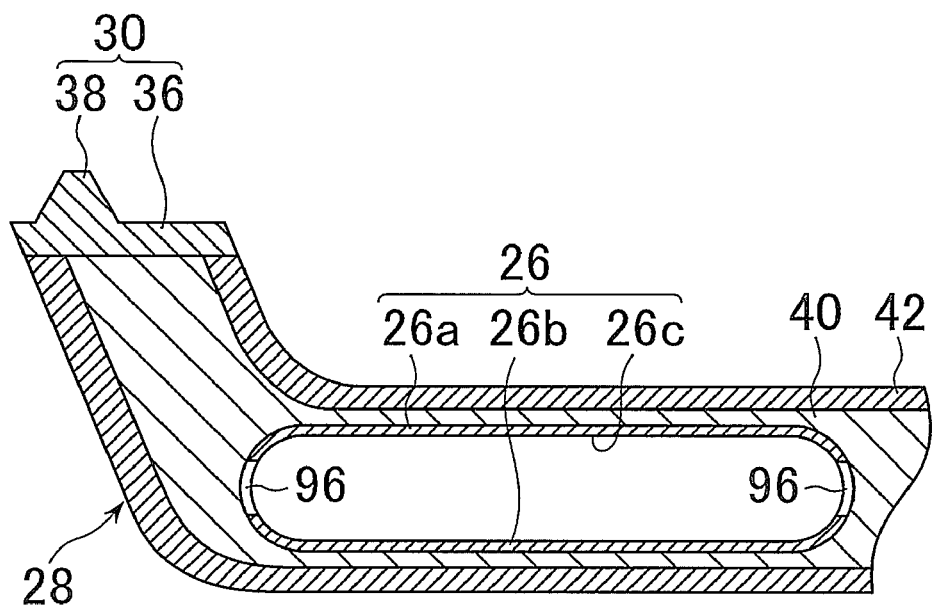
FIG. 20 is a vertical cross-sectional view of the probe shown in FIG. 17 in a state where its low resistance material has been removed.
Figure 21:
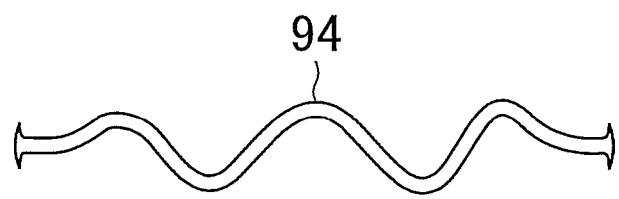
FIG. 21 is a front view showing an embodiment of a low resistance material to be used in the probe shown in FIG. 17.

In a case where the low resistance material 94 is to be manufactured separately from the probe tip region 30 and the main portion 32, the probe 92 can be manufactured by making the probe tip region 30 and the main portion 32 as shown in FIG. 20, making the low resistance material 94 as shown in FIG. 21, and attaching the low resistance material 94 to the probe tip region 30 and the main portion 32 by a conductive adhesive as shown in FIG. 19.

The low resistance material 94 may be attached to the highly tenacity material 40 so as to electrically short-circuit the highly tenacity material 40 around the elongated hole 26c or may be attached to the highly conductive material 42 so as to electrically short-circuit the highly conductive material 42 around the elongated hole 26c.

In the example shown in the figures, holes 96 in which the respective end portions of the low resistance material 94 can be inserted are formed in the highly tenacity material 40 around the elongated hole 26c, and the respective end portions of the low resistance material 94 are inserted in the holes 96 in a state where the low resistance material 94 extends in the longitudinal direction of the elongated hole 26c to short-circuit the highly conductive material 42 by means of the low resistance material 94 around the elongated hole 26c.

Figure 22:
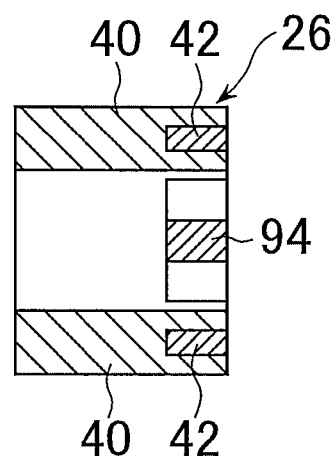
FIG. 22 is a bottom view showing a modification example of the probe shown in FIG. 17.

Instead of arranging the low resistance material 94 at the arm region 26 so that the low resistance material 94 is located at the center in the thickness direction of the arm region 26, the low resistance material 94 may be arranged at the arm region 26 in a state where the low resistance material 94 is displaced to one side in the thickness direction of the arm region 26 as shown in FIG. 22.

Figure 23:
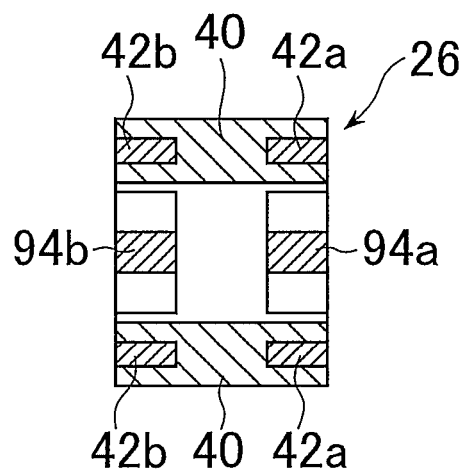
FIG. 23 is a bottom view showing another modification example of the probe shown in FIG. 17.

Also, as shown in FIG. 23, the low resistance material 94 may be constituted by first and second low resistance portions 94a, 94b, and the low resistance material 94 may be arranged at the arm region 26 in a state where the first and second low resistance portions 94a and 94b are displaced to one side and the other side in the thickness direction of the arm region 26, respectively.

The example shown in FIG. 22 represents a case where the modification example shown in FIG. 6 has been applied to the highly conductive material 42, and the example shown in FIG. 23 represents a case where the modification example shown in FIG. 8 has been applied to the highly conductive material 42.

In the case of a probe using the low resistance material 94, it does not have to have the highly conductive material 42.

INDUSTRIAL APPLICABILITY

The present invention is not limited to the above embodiments, but can be altered without departing from the spirit of the present invention.

The invention claimed is:

1. An electrical test probe comprising:
a plate-shaped main portion having a base end to be attached to a support board and a tip end opposite said base end, said main portion being made of a tenacity material; and
a probe tip portion arranged at said tip end of said main portion and having a probe tip to contact an electrode of a device under test,
wherein said main portion further includes a conductive material extending from said base end to said tip end, at least part of said conductive material being buried within said tenacity material,
wherein said tenacity material has higher resiliency than that of said conductive material while said conductive material has higher conductivity than that of said tenacity material,
wherein said main portion includes a plate-shaped seat region having said base end, a plate-shaped arm region extending in a cantilevered manner in a first direction from an end portion opposite said base end side of said seat region, and a plate-shaped tip end region protruded from the tip end of said arm region in a second direction intersecting with said first direction and having said tip end, and
wherein said arm region includes a pair of first and second arm portions spaced from each other in said second direction by an elongated hole penetrating said arm region in its thickness direction and extending in said first direction and is electrically short-circuited by a low resistance material extending in said first direction within said elongated hole from one end portion to another end portion of said elongated hole in its longitudinal direction.

2. The electrical test probe according to claim 1, wherein said conductive material is exposed at said base end and contacts said probe tip portion.

3. The electrical test probe according to claim 1, wherein said conductive material is buried within said tenacity material.

4. The electrical test probe according to claim 1, wherein said conductive material is exposed on one surface of said main portion.

5. The electrical test probe according to claim 1, wherein said probe tip portion is made of a conductive metal material having higher hardness than that of said tenacity material.

6. The electrical test probe according to claim 1, wherein said probe tip portion further has a seat portion extending in a first direction, coupled integrally with said tip end, and said probe tip is protruded in a second direction from said seat portion.

7. An electrical test probe comprising:
a plate-shaped main portion having a base end to be attached to a support board and a tip end opposite said base end, said main portion being made of a tenacity material; and
a probe tip portion arranged at said tip end of said main portion and having a probe tip to contact an electrode of a device under test,
wherein said main portion includes a plate-shaped seat region having said base end, a plate-shaped arm region extending in a cantilevered manner in a first direction from an end portion opposite said base end side of said seat region, and a plate-shaped tip end region protruded from the tip end of said arm region in a second direction intersecting with said first direction and having said tip end,
wherein said arm region includes a pair of first and second arm portions spaced from each other in said second direction by an elongated hole penetrating said arm region in its thickness direction and extending in said first direction and is electrically short-circuited by a low resistance material extending in said first direction within said elongated hole from one end portion to another end portion of said elongated hole in its longitudinal direction, and
wherein said tenacity material has higher resiliency than that of said low resistance material while said low resistance material has higher conductivity than that of said tenacity material.

8. The electrical test probe according to claim 7, wherein said main portion includes a conductive material at least part of which is buried within said tenacity material, and wherein said tenacity material has higher resiliency than that of said conductive material while said conductive material has higher conductivity than that of said tenacity material.

9. An electrical test probe comprising:

a plate-shaped main portion having a base end to be attached to a support board and a tip end opposite said base end, said main portion being made of a tenacity material; and a probe tip portion arranged at said tip end of said main portion and having a probe tip to contact an electrode of a device under test, wherein said main portion further includes a conductive material extending from said base end to said tip end, at least part of said conductive material being buried within said tenacity material, wherein said tenacity material has higher resiliency than that of said conductive material while said conductive material has higher conductivity than that of said tenacity material, and wherein said conductive material has a first conductor exposed on one surface of said main portion and a second conductor exposed on another surface of said main portion.

* * * * *